United States Patent [19]
Carey et al.

[11] Patent Number: 5,075,965
[45] Date of Patent: Dec. 31, 1991

[54] LOW TEMPERATURE CONTROLLED COLLAPSE CHIP ATTACH PROCESS

[75] Inventors: Charles F. Carey, Endicott; Kenneth M. Fallon, Johnson City; Rochelle Ginsburg, Vestal; Charles G. Woychik, Endicott, all of N.Y.

[73] Assignee: International Business Machines, Armonk, N.Y.

[21] Appl. No.: 608,766

[22] Filed: Nov. 5, 1990

[51] Int. Cl.$^5$ .............................................. H05K 3/34
[52] U.S. Cl. .................................... 29/840; 228/180.2
[58] Field of Search ........................ 29/840; 228/180.2

[56] References Cited

U.S. PATENT DOCUMENTS

| | | | |
|---|---|---|---|
| 3,716,421 | 2/1973 | Burkhart et al. | 148/6.14 R |
| 4,373,656 | 2/1983 | Parker, Jr. et al. | 228/203 |
| 4,673,772 | 6/1987 | Satoh et al. | 228/180.2 X |
| 4,731,128 | 3/1988 | Casullo | 428/470 |
| 4,967,950 | 11/1990 | Legg et al. | 228/180.2 |

FOREIGN PATENT DOCUMENTS

| | | | |
|---|---|---|---|
| 258314 | 7/1982 | Fed. Rep. of Germany | 228/180.2 |
| 62-14433 | 1/1987 | Japan | 228/180.2 |

OTHER PUBLICATIONS

IBM J. Research Devel., May 1969, pp. 226–238, by P. A. Totta et al.
IBM Technical Discl Bull., vol. 29, No. 11, Apr. 1987, pp. 4736–4737.
IBM Technical Discl Bull., vol. 30, No. 11, Apr. 1988, pp. 475–477.
"Joining Materials and Processes in Electronic Packaging", Principles of Electronic Packaging, 1988, pp. 577–619, Woychik & Senger.
"Chip to Package Interconnections"—Microelectronic Packaging Handbook, 1988, pp. 361–453, Koopman et al.

*Primary Examiner*—Carl J. Arbes
*Attorney, Agent, or Firm*—Richard M. Goldman

[57] ABSTRACT

A controlled collapse chip connect method of joining an IC chip to a microelectronic circuit card. According to the method an inhomogeneous, anisotropic column of solder is deposited from a Pb/Sn alloy onto solder wettable I/O terminals of the I/C chip, without subsequent homogenizing reflow. The solder core has a Pb rich core and an Sn rich cap. The matching footprint of the solder wettable I/O terminals on the microelectronic circuit card is substantially free of deposited solder and presents a protected Cu surface to the solder columns, or, at most a surface of Cu and anti-oxidant. The chip is aligned with the corresponding footprints on the microelectronic circuit card, and the solder is reflowed to bond the chip to the microelectronic circuit card.

11 Claims, 3 Drawing Sheets

LOW TEMPERATURE CONTROLLED COLLAPSE CHIP ATTACH PROCESS

FIELD OF THE INVENTION

This invention relates to electronic circuit packages, and more particularly to an improved controlled collapse chip connection (hereinafter referred to as "C4") direct chip attach method. The direct chip attach method combines improved solder metallurgy with improved ball limiting metallurgy (hereinafter "BLM") on the I/O surface of the chip, and improved top surface metallurgy (hereinafter "TSM") on the substrate to which the chip and its associated solder ball are attached. This invention relates especially to a fluxless, low temperature chip attach method, characterized by a Pb rich solder column having an Sn rich cap extending from the chip I/O, and the absence of a eutectic composition plate on the card. According to the method of the invention the number of chip attach processing steps is reduced and a higher standoff is obtained.

BACKGROUND OF THE INVENTION

The general structures and manufacturing processes for electronic packages are described in, for example, Donald P. Seraphim, Ronald Lasky, and Che-Yo Li, *Principles of Electronic Packaging,* McGraw-Hill Book Company, New York, N.Y., (1988), and Rao R. Tummala and Eugene J. Rymaszewski, *Microelectronic Packaging Handbook,* Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements. Fourth, the second level package provides for thermal management, i.e., heat dissipation.

In order for the card to accomplish these functions the I/C chip must be bonded to the card, and connected to the wiring of the card. When the number of I/O's per chip was low, serial wire bonding of the I/O's around the periphery of the chip was a satisfactory interconnection technology. But, as the number of I/O's per chip has increased, tape automated bonding (hereinafter "TAB" bonding) has supplanted serial wire bonding. To handle an even larger number of I/O's per chip various "flip chip" bonding methods were developed. In these so-called "flip chip" bonding methods the face of the IC chip is bonded to the card.

Flip chip bonding is described by Charles G. Woychik and Richard C. Senger, "Joining Materials and Processes in Electronic Packaging," in Donald P. Seraphim, Ronald Lasky, and Che-Yo Li, *Principles of Electronic Packaging,* McGraw-Hill Book Company, New York, N.Y., (1988), at pages 577 to 619, and especially pages 583 to 598, and by Nicholas G. Koopman, Timothy C. Reiley, and Paul A. Totta, "Chip-To-Package Interconnections" in Rao R. Tummala and Eugene J. Rymaszewski, *Microelectronic Packaging Handbook,* Van Nostrand Reinhold, New York, N.Y. (1988), at pages 361 to 453, and especially pages 361 to 391, both of which are hereby incorporated herein by reference. As described therein. flip-chip bonding allows forming of a pattern of solder bumps on the entire face of the chip. In this way the use of a flip chip package allows full population area arrays of I/O. In the flip chip process solder bumps are deposited on solder wettable terminals on the chip and a matching footprint of solder wettable terminals are provided on the card. The chip is then turned upside down, hence the name "flip chip," the solder bumps on the chip are aligned with the footprints on the substrate, and the chip to card joints are all made simultaneously by the reflow of the solder bumps.

In the C4 process, as distinguished from the earlier flip chip process, the solder wettable terminals on the chip are surrounded by ball limiting metallurgy ("BLM"), and the matching footprint of solder wettable terminals on the card are surrounded by glass dams or stop-offs, which are referred to as top surface metallurgy ("TSM"). These structures act to limit the flow of molten solder during reflow.

The ball limiting metallurgy ("BLM") on the chip is typically a circular pad of evaporated, thin films of Cr, Cu, and/or Au, as described, for example by P. A. Torta and R. P. Sopher, "STL Device Metallurgy and Its Monolithic Extension," *IBM Journal of Res. and Dev.,* 13 (3), p. 226 (1969), incorporated herein by reference. The Cr dam formed by this conductive thin film well restrains the flow of the solder along the chip, seals the chip module, and acts as a conductive contact for the solder. In prior art processes the BLM and solder are deposited by evaporation through a mask, forming an array of I/O pads on the wafer surface. The term "mask" is used generically. The mask can be a metal mask. Alternatively, as used herein, the "mask" can refer to a sequence of BLM deposition, photoresist application, development of the photoresist, and deposition, as described below, of solder, followed by simultaneous removal of the photoresist and subetching of the BLM, with the solder column acting as a mask.

In prior art C4 processes the Pb/Sn is typically deposited from a molten alloy of Pb and Sn. The Pb has a higher vapor pressure then Sn, and deposits first, followed by a cap of Sn. The solder is deposited on the chip by evaporation, vacuum deposition, vapor deposition, or electrodeposition into the above described BLM wells, thereby forming solder columns therein. The resulting solder deposit, referred to herein as a column or a ball, is a cone-frustrum body of Pb surround by an Sn cap. This column or ball may be reflowed, for example by heating in an $H_2$ atmosphere, to homogenize the solder and form solder bumps for subsequent bonding.

The solder is typically a high lead solder, such as 95 Pb/5 Sn. In conventional C4 processes, 95/5 solders are preferred because the high lead solders of this stoichiometry have a high melting point, e.g., above about 315 degrees Centigrade. Their high melting temperature allows lower melting point solders to be used for subsequent connections in the microelectronic package.

The wettable surface contacts on the card are the "footprint" mirror images of the solder balls on the chip I/O's. The footprints are both electrically conductive and solder wettable. The solder wettable surface contacts forming the footprints are formed by either thick film or thin film technology. Solder flow is restricted by the formation of dams around the contacts.

The chip is aligned, for example self-aligned, with the card, and then joined to the card by thermal reflow. Typically, a flux is used in prior art C4 processes. The flux is placed on the substrate, or chip, or both, to hold the chip in place. The assembly of chip and card is then subject to thermal reflow in order to join the chip to the card. After joining the chip and card it is necessary to remove the flux residues. This requires the use of organic solvents, such as aromatic solvents and halogenated hydrocarbon solvents, with their concomittant environmental concerns.

To be noted is that the C4 process is a substantially self-aligning assembly process. This is because of the interaction of the geometry of the solder columns or balls prior to reflow with the surface tension of the molten solder during reflow and geometry of the solder columns. When mating surfaces of solder column on the chip and the conductive footprint contact on the card touch, the surface tension of the molten solder will result in self alignment.

OBJECTS OF THE INVENTION

It is one object of the invention to provide for high density cards and boards.

It is a further object of the invention to eliminate the need for ceramic substrate chip carriers through the use of direct chip attach to polymeric type materials, for example, FR-4 prepreg epoxy-glass fiber composites, at lower temperatures then, for example, the melting temperature of 95Pb/5Sn solder.

It is a still further object of the invention to reduce the number of steps in direct chip attach.

It is a still further aspect of the invention to provide for "in situ" electrical testing and burn in of I/C chips, while allowing reflow and/or mechanical breakage of joints for rework.

It is another aspect of this object of the invention to provide improved solder metallurgy and metallurgical control.

SUMMARY OF THE INVENTION

According to the invention disclosed herein the problems of the prior art are obviated and the objects of the invention are attained. The invention relates to a controlled collapse chip connection ("C4") direct chip attach method of joining an IC chip to a microelectronic circuit card and the circuit prepared thereby. According to the invention solder is deposited on solder wettable I/O terminals of the I/C chip. The solder is deposited from a molten pool of Pb/Sn solder alloy containing at least about 6 atomic percent Sn. The solder is initially deposited on the I/O terminals of the I/C chip so as to form an inhomogeneous, anisotropic column having a relatively Pb-rich core and a relatively Sn-rich cap.

There is a matching footprint of conductive, solder wettable I/O terminals on the microelectronic circuit card. In contradistinction to the practice of the prior art, the solder wettable I/O terminals are substantially free of deposited solder alloy, and present a Cu surface, or optionally a surface of Cu and oxidation inhibitor.

The solder deposits on the chip are aligned with the corresponding footprints on the microelectronic circuit card, and the solder is reflowed to form at least zones or regions of a Pb/Sn eutectic in the solder column and thereby bond the chip to the microelectronic circuit card.

The process can be carried out without flux, thereby obviating the need for organic solvents.

THE FIGURES

The invention may be understood by reference to the FIGURES.

DETAILED DESCRIPTION OF THE INVENTION

According to the invention disclosed herein the problems of the prior art are obviated and the objects of the invention are attained by an improved solder metallurgy that obviates the necessity for both flux on the IC chip and a Pb/Sn solder alloy electroplated on the card lands. The invention relates to a controlled collapse chip connect ("C4") method of joining an IC chip to a microelectronic circuit card and the circuit prepared thereby.

Figure 1:
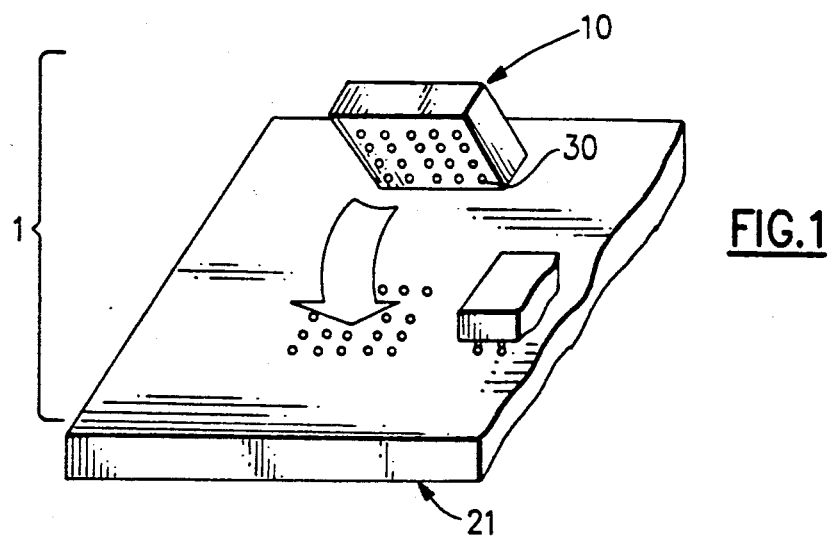
FIG. 1 is a representation of the general arrangement of an I/C chip, a card, including the solder bumps on the I/O's of the I/C chip, and corresponding recessed lands on the card.

A representation of the general arrangement of an an unassembled package 1 is shown in FIG. 1. This package 1 includes an I/C chip 10 and a card 21 to be joined by C4 bonding. Solder bumps 30 are present on the I/O's 11 of the I/C chip 10. These solder bumps 30 on the IC chip 10 correspond to recessed lands 51 on the circuit card 21.

Figure 2:
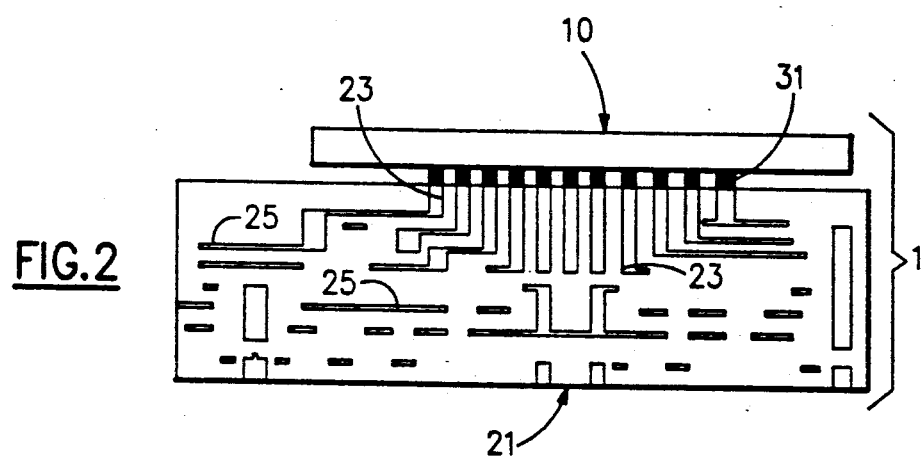
FIG. 2 is a cutaway view of an IC chip mounted on a card, showing the solder joints between the IC chip and the card, and the internal circuitry of the card.

A cutaway view of the assembled microelectronic circuit package 1 is shown in cutaway in FIG. 2. FIG. 2 shows an IC chip 10 mounted on a circuit card 21. The IC chip 10 is electrically connected and metallurgically bonded to the circuit card 21 by the solder joints 31. FIG. 2 also shows the internal circuitry of the card 21, for example through holes and vias 23, and signal planes and power planes 25.

Figure 3:
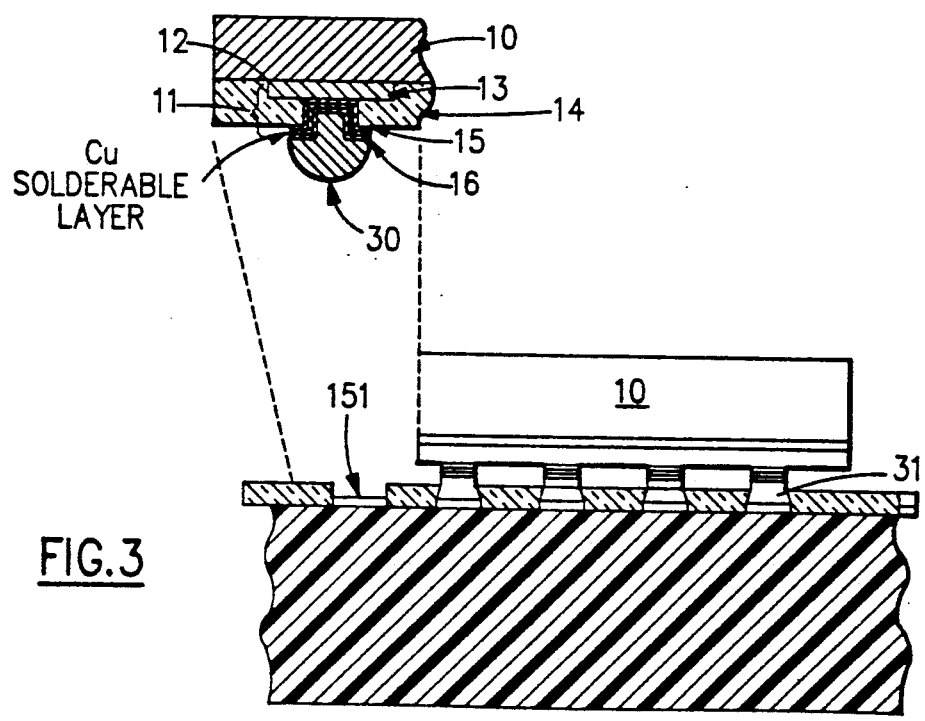
FIG. 3 is a cutaway view of an IC chip and card with a reflowed solder ball connector representative of the prior art.

FIG. 3 is a cutaway view of an IC chip 10 and card 21 with a reflowed solder ball connector 31. This structure is representative of the prior art. The IC chip 10 has an array of I/O leads 11, i.e., contacts 12 on the internal leads 13. The individual contacts 12 are surrounded by a passivation layer 14. Recessed within the passivation layer 14 are wells with an adhesion layer 15, as a Cr adherence layer 15, and a flash layer 16, as an Au flash layer 16. Extending outwardly from the chip 10 is the solder ball 30. The solder ball 30 has a characteristic spherical shape because it has been reflowed. The circuit card 21 has a eutectic Sn-Pb coated in land 151.

According to the invention solder is deposited on solder wettable I/O terminals of the I/C chip 10. The solder is deposited from a source of Pb/Sn, such as a molten pool of Pb/Sn solder alloy, containing a cap forming amount of Sn. By a cap forming amount of Sn is meant an amount of Sn that when the Pb/Sn solder alloy is deposited from the melt or vapor, the resulting as deposited and un-reflowed deposit has a Sn rich cap 37 thereon that is thick enough to form zones and/or regions of Pb/Sn eutectic upon subsequent reflow, thereby obviating the necessity of flux on the IC chip 10 and of electroplated Pb/Sn 151 on the card 21. By a Sn-rich cap 37 is meant a cap 37 that is in excess of 0.5 mil thick upon deposition and solidification, and contains in excess of 73.1 atomic percent Sn ( 61.9 weight percent Sn) upon deposition and solidification. This requires a bulk alloy containing at least about 6 atomic percent nominal Sn content. The solder is initially deposited on the I/O terminals 11 of the I/C chip 10 so as to form an inhomogeneous, anisotropic column 33 having a relatively Pb-rich core 35 and a relatively Sn-rich cap 37.

There is a matching footprint of solder wettable I/O terminals 51 on the microelectronic circuit card 21. In contradistinction to the practice of the prior art, the solder wettable I/O terminals 51 are substantially free of deposited solder alloy surface 151, and present a Cu surface 51, or optionally a surface 53 of Cu and oxidation inhibitor.

Figure 4:
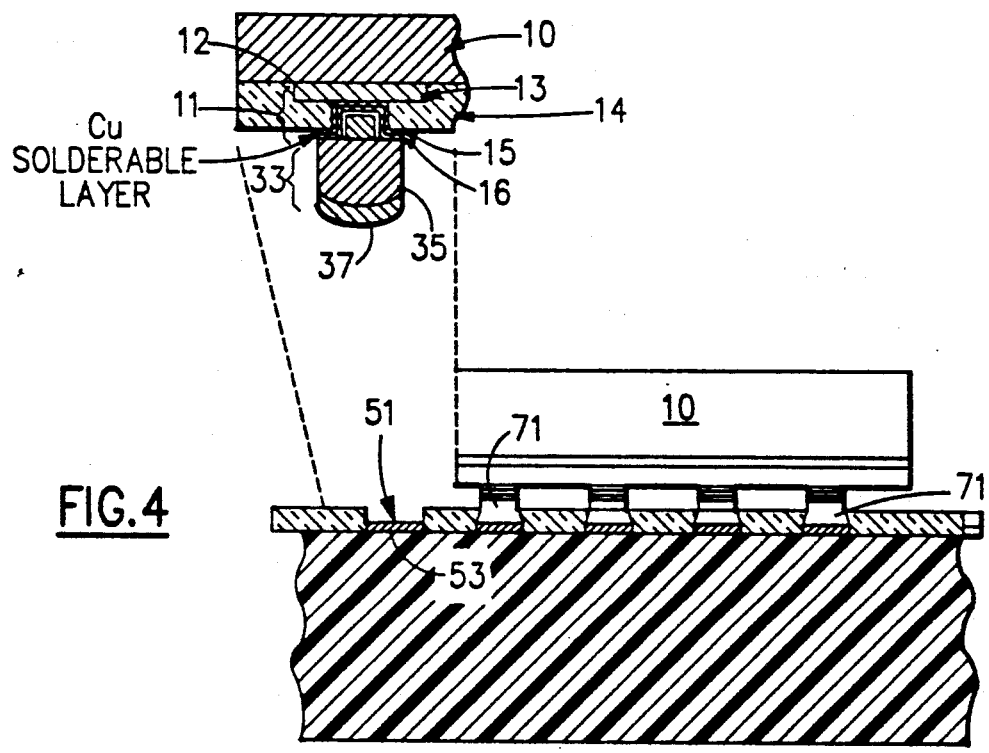
FIG. 4 is a corresponding cutaway view of an IC chip and card with a nonreflowed solder column connector, and a Cu land of the instant invention.

The structure of the IC chip 10 and the card 21 of the invention are clearly shown in FIG. 4. FIG. 4 is a cutaway view, of an IC chip 10 and card 21 with a nonreflowed solder column connector 33, and a Cu land 53. The IC chip 10 also has an array of contacts 11 on the internal leads 12. The individual contacts 11 are surrounded by a passivation layer 14. Recessed within the passivation layer are wells with an adhesion layer 15, as a Cr adhesion layer 15, and a flash layer 16, as an Au flash layer 16. Extending outwardly from the chip 10 is the solder column 33. This solder column 33 has not been reflowed, melted, or remelted. It is a compositionally inhomogeneous and anisotropic column 33, with a Sn-rich cap 37 atop a Pb-rich core 35. The circuit card 21 has copper coated lands 53 corresponding to the solder columns 33 on the IC chip 10. The height of the solder column 33, combined with the increased via height at the land site 51 on the card 21 provides increased mechanical reliability.

Figure 5A:
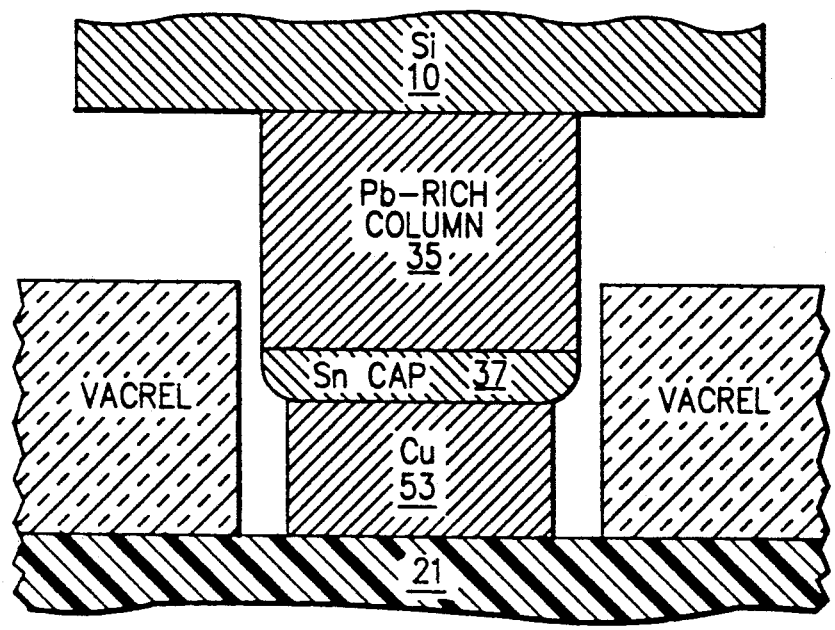
FIG. 5A is a schematic representation of the IC chip, solder column, and card land according to one embodiment of the invention prior to melting and connecting.

The solder deposits 33 on the chip 21 are aligned with the corresponding Cu 53 land 51 footprints on the microelectronic circuit card 21. FIG. 5A is a schematic representation of the IC chip 10, with the compositionally anisotropic solder column 33, including the Pb rich core 35 and the Sn rich cap 37 during alignment and prior to melting and connecting. The solder column 33, which has not previously been reflowed, is now reflowed to form a Pb/Sn eutectic and bond the chip 10 to the microelectronic circuit card 21 (FIG. 5B).

Figure 5B:
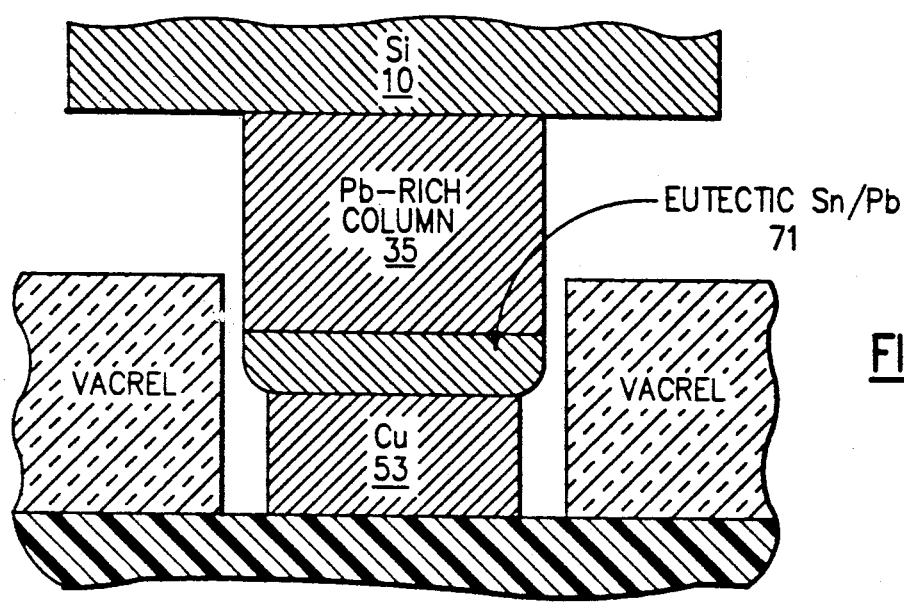
FIG. 5B is a schematic representation of the IC chip, solder column, and card land of FIG. 5A after melting and connecting.

FIG. 5B is a schematic representation of the IC chip 10, including the solder column 33, and the Cu plated 53 card land 51 of FIG. 5A after reflowing the solder column 33. Reflowing is carried out at a temperature in excess of the Pb/Sn eutectic temperature, 183 degrees C. Heating may be carried out by vapor phase heating. Bonding occurs by the formation of the Pb/Sn eutectic alloy at the Pb rich core 35 - Sn rich cap 37 interface. The Sn rich cap 37 interacts with the Pb rich core 35 of the solder column 31 to form the Sn/Pb eutectic.

The Pb/Sn eutectic is 26.1 atomic percent Pb (38.1 weight percent Pb), and its formation is favored by the large amount of Sn in proximity to the Pb, that is, by Sn in the Sn rich cap 37 in proximity to the Pb in the Pb rich core 35. The size of the Sn rich cap 37 can be enhanced by the use of an alloy with a high nominal Sn concentration, that is, 6 atomic percent or more Sn, basis total Sn and Pb.

The reflowing step of the process of the invention can be carried out without flux. This is because the thin layer of Sn oxide that forms over the Sn rich cap 37 dissolves in the eutectic solder. Fluxless reflowing obviates the need for organic solvents to remove the flux.

As shown in FIGS. 5A and 5B, the lands 51 are free of plated solder 151, not requiring any Sn/Pb electroplate. The Sn rich cap 37 serves as the Sn supply for eutectic formation, thereby obviating the need for a Pb/Sn electroplate 151 on the card lands 51. In a preferred embodiment, an anti-oxidant or corrosion inhibitor, such as Entek may be applied to the lands 51.

Figure 6A:
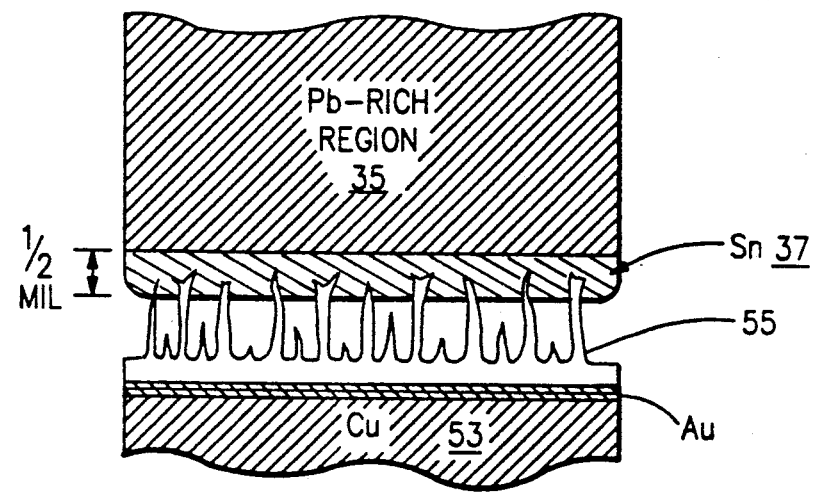
FIG. 6A is a schematic representation of the IC chip, solder column, and card land according to an alternative embodiment of the invention where dendrites are present on the card lands prior to melting and connecting.
Figure 6B:
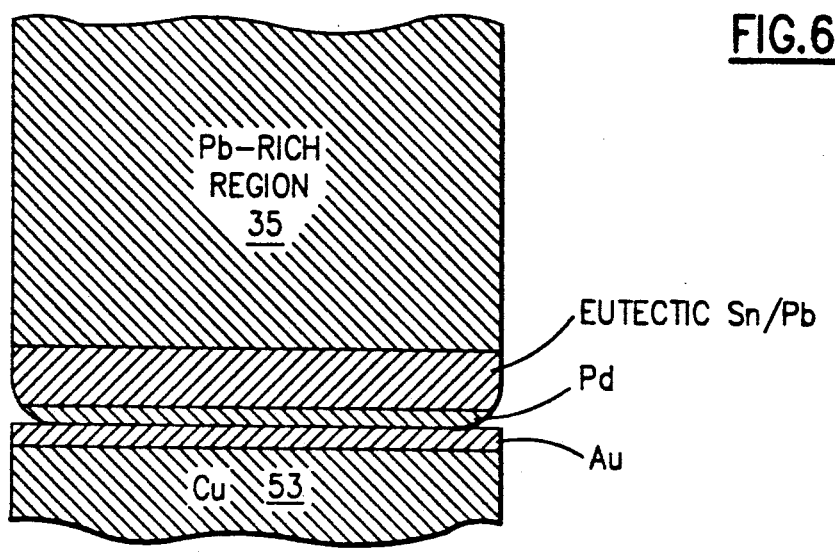
FIG. 6B is a schematic representation of the IC chip, solder column, and card land of FIG. 6A after melting and connecting.

An alternative exemplification of the invention is shown in FIGS. 6A and 6B. In the structure shown in FIG. 6A dendrites 55 are present on the card lands 51 prior to melting and connecting. These dendrites 55, which may be formed of Cu, Pd, and Cu-Pd alloys, form a reversible mechanical connection prior to reflow. This allows electrical test and burn-in of the IC chip 10 and card 21 without the necessity for solder rework should chip rework be necessary.

The dendrites 55 can be formed by various methods, such as electroplating, electroless plating, vapor deposition, or the like. The package 1 is then assembled by placing the non-reflowed columns 33 directly on the dendritic 55 pads 53. The dendrites 55 pierce the Sn rich caps 37 of the solder columns 33 to provide mechanical and electrical interconnection. Electrical testing and IC chip "burn in" can then be performed. The IC chips 10 can be removed and replaced if needed. Temporary dendrite bonding is feasible because of the mechanical connection, and because no flux is required for reflow.

FIG. 6B is a schematic representation of the IC chip 10, solder column 33, and card land 53 of FIG. 6A after melting and connecting.

The method of the invention results in the fabrication of high electronic packages through controlled chip collapse connection direct chip attach. The direct chip attach method of the invention has a reduced number of steps, and includes, among other expedients, eliminating the plating of solder onto the card, and eliminating fluxing the solder on the IC chips during attach of the chips to the carrier, as well as eliminating reflowing the solder on the IC chips. These aspects of the invention not only reduce the number of steps in direct chip attach but also provide improved metallurgy.

While the invention has been described with respect to certain preferred embodiments and exemplifications thereof, it is not intended to limit the scope of the invention thereby, but solely by the claims appended hereto.

We claim:

1. In a method of joining an IC chip to a microelectronic circuit card comprising the steps of depositing solder on solder wettable I/O terminals of the I/C chip, providing a matching footprint of solder wettable I/O terminals on the microelectronic circuit card, aligning the solder on the chip with the corresponding footprints on the microelectronic circuit card, and reflowing the solder to bond the chip to the microelectronic circuit card, the improvement comprising: depositing the solder from a Pb/Sn alloy containing a cap forming amount of Sn in excess of the eutectic amount thereof and forming a compositionally inhomogeneous, anisotropic column of the Pb/Sn alloy having an Sn rich cap and a Pb rich interior core; bringing the solder columns into contact with corresponding Cu land I/O terminals on the microelectronic circuit card; said microelectronic circuit card Cu land I/O terminals having a protected Cu surface for bonding directly to the solder, and heating the solder to form a Pb/Sn eutectic composition.

2. The method of claim 1 comprising forming a solder column having an Sn rich cap at least about 0.5 mil thick.

3. The method of claim 2 comprising depositing the Pb/Sn solder alloy column from a Pb/Sn solder alloy having a nominal bulk alloy composition of at least 6 atomic percent Sn.

4. The method of claim 1 comprising forming a solder column having an Sn rich cap comprising at least 73.9 atomic percent Sn.

5. The method of claim 1 comprising depositing the Pb/Sn solder alloy column from a Pb/Sn solder alloy containing at least about 6 atomic percent Sn.

6. The method of claim 1 comprising depositing the Pb/Sn solder alloy column from a Pb/Sn solder alloy containing at least about 6 atomic percent Sn, and forming a solder column having an Sn rich cap at least about 0.5 mil thick, said Sn rich cap comprising at least about 73.9 atomic percent Sn.

7. The method of claim 1 comprising bonding said solder column on the IC chip to a protected Cu land, substantially free of solder alloy, on the card.

8. The method of claim 1 comprising forming dendrites on the Cu lands of the card.

9. The method of claim 8 wherein the dendrites comprise a metal chosen from the group consisting of Cu, Pd, and alloys thereof.

10. In a method of joining an IC chip to a microelectronic circuit card comprising the steps of depositing solder on solder wettable I/O terminals of the I/C chip, providing a matching footprint of solder wettable I/O terminals on the microelectronic circuit card, aligning the solder on the chip with the corresponding footprints on the microelectronic circuit card, and reflowing the solder to bond the chip to the microelectronic circuit card, the improvement comprising: depositing the solder from a Pb/Sn alloy containing a cap forming amount of Sn in excess of the eutectic amount thereof and forming a compositionally inhomogeneous and anisotropic solder column having an Sn rich cap and a Pb rich interior core; bringing the solder columns into contact with corresponding Cu land I/O terminals on the microelectroinc circuit card; said microelectronic circuit card Cu land I/O terminals having a Cu surface with dendrites thereon formed from a metal chosen from the group consisting of Cu, Pd, and alloys thereof for reversibly mechanically connecting the IC chip to the circuit card for electrical testing prior to solder bonding the IC chip to the circuit card; and heating the solder to form a Pb/Sn eutectic solder bond.

11. In a method of joining an IC chip to a microelectronic circuit card comprising the steps of depositing solder on solder wettable I/O terminals of the I/C chip, providing a matching footprint of solder wettable I/O terminals on the microelectronic circuit card, aligning the solder on the chip with the corresponding footprints on the microelectronic circuit card, and reflowing the solder to bond the chip to the microelectronic circuit card, the improvement comprising:

(1). depositing the solder from a Pb/Sn alloy containing a cap forming amount of Sn in excess of the eutectic amount thereof and forming a compositionally inhomogeneous and anisotropic solder column having an Sn rich cap and a Pb rich interior core;

(2). bringing the solder columns into contact with corresponding Cu land I/O terminals on the microelectronic circuit card, said microelectronic circuit card Cu land I/O terminals having a Cu surface with dendrites thereon formed from a metal chosen from the group consisting of Cu, Pd, and alloys thereof;

(3). reversibly mechanically connecting the IC chip to the circuit card for electrical testing prior to solder bonding the IC chip to the circuit card; and (4). thereafter heating the solder to form a Pb/Sn eutectic solder bond, bonding the IC chip to the card.

* * * * *